(12) United States Patent
Song (10) Patent No.: US 7,453,291 B2
(45) Date of Patent: Nov. 18, 2008

(54) SWITCH LINEARIZED TRACK AND HOLD CIRCUIT FOR SWITCH LINEARIZATION

(75) Inventor: Bang-Sup Song, La Jolla, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 11/222,227

(22) Filed: Sep. 8, 2005

(65) Prior Publication Data

US 2006/0049857 A1    Mar. 9, 2006

Related U.S. Application Data

(60) Provisional application No. 60/608,508, filed on Sep. 9, 2004.

(51) Int. Cl.
*H03K 5/00* (2006.01)
(52) U.S. Cl. .......................................... 327/91; 327/92
(58) Field of Classification Search ................ 327/91, 327/93–96; 341/122
See application file for complete search history.

(56) References Cited

U.S. PATENT DOCUMENTS

| | | | | |
|---|---|---|---|---|
| 5,084,634 A | * | 1/1992 | Gorecki | 327/91 |
| 6,052,000 A | * | 4/2000 | Nagaraj | 327/94 |
| 6,090,914 A | * | 7/2000 | Linsley et al. | 530/350 |
| 6,310,565 B1 | * | 10/2001 | Ong et al. | 341/122 |
| 6,323,697 B1 | * | 11/2001 | Pavan | 327/94 |
| 6,525,574 B1 | * | 2/2003 | Herrera | 327/94 |

OTHER PUBLICATIONS

T.B. Cho, P.R. Gray, "A 10-bit, 20-MS/s, 35-mW Pipeline A/D Converter", IEEE J. of Solid-State Circuits, vol. 30, Mar. 1995, pp. 166-172.
T.L. Brooks, D.H. Robertson, D.F. Kelly, A. Del Muro, S.W. Harston, "A Cascaded Sigma-Delta Pipeline A/D Converter with 1.25 MHz Signal Bandwidth and 89 dB SNR", IEEE J. of Solid-State Circuits, vol. 3, Dec. 1997, pp. 1896-1906.
H. Pan, M. Segami, M. Choi, J. Cao, A.A. Abidi, "A 3.3-V 12-b 50-MS/s A/D Converter in 0.6-μm CMOS with over 80-dB SFDR", IEEE J. of Solid-State Circuits, vol. 35, Dec. 2000, pp. 1769-1780.
S. Limotyrakis, S.D. Kulchycki, D. Su, B.A. Wooley, "A 150MS/s 8b 71mW Time-Interleaved ADC in 0.18 μm CMOS", IEEE International Solid-State Circuits Conference Digest, Feb. 2000, pp. 258-259.

* cited by examiner

*Primary Examiner*—Tuan T. Lam
*Assistant Examiner*—Hiep Nguyen
(74) *Attorney, Agent, or Firm*—Greer, Burns & Crain, Ltd (57) ABSTRACT

Circuits that provide a gate boost to address non-linear threshold voltage variation in a CMOS T/H circuit. In embodiments of the invention, a boost capacitor and a feedback amplifier add a signal-dependent threshold voltage to the switch gate over-drive voltage of a switch that controls track and hold circuit sampling. In a modified embodiment, capacitive boost is omitted and the feedback amplifier provides the signal-dependent threshold voltage boost. In another embodiment, a boost capacitor and a diode connected transistor provide the signal-dependent threshold voltage boost. In a modified embodiment, capacitive boost is omitted and the diode connected transistor provides the signal-dependent threshold voltage.

10 Claims, 8 Drawing Sheets

SWITCH LINEARIZED TRACK AND HOLD CIRCUIT FOR SWITCH LINEARIZATION

RELATED APPLICATION AND PRIORITY CLAIM

This application is related to and claims priority under 35 U.S.C. § 119 from prior provisional application Ser. No. 60/608,508, filed Sep. 9, 2004.

FIELD OF THE INVENTION

The field of the invention is analog to digital signal conversion. An exemplary application of the invention is to CMOS track and hold circuits (T/H).

BACKGROUND

Sampled-data analog signal processing is widely used in analog/digital integrated systems. With an analog-to-digital converter (ADC) and proper sampling, most signal processing functions can be achieved digitally with high accuracy, which can meet or even exceed analog signal processing accuracy. Example signal processing functions used in a variety of applications from communications to measurement include filtering, timing recovery, and demodulation.

During analog to digital conversion, the analog signal is sampled. This is typically achieved with sample-and-hold (S/H) or track-and-hold (T/H) circuits at the input that accepts the analog signal. S/H and T/H circuits hold a discrete value of the input taken at an instant of time to permit an analog to digital conversion circuit to see a fixed voltage that may be converted into a digital value. In CMOS technology, S/H is the more commonly used technique because most ADCs are implemented in switched-capacitor circuits.

Figure 1A:
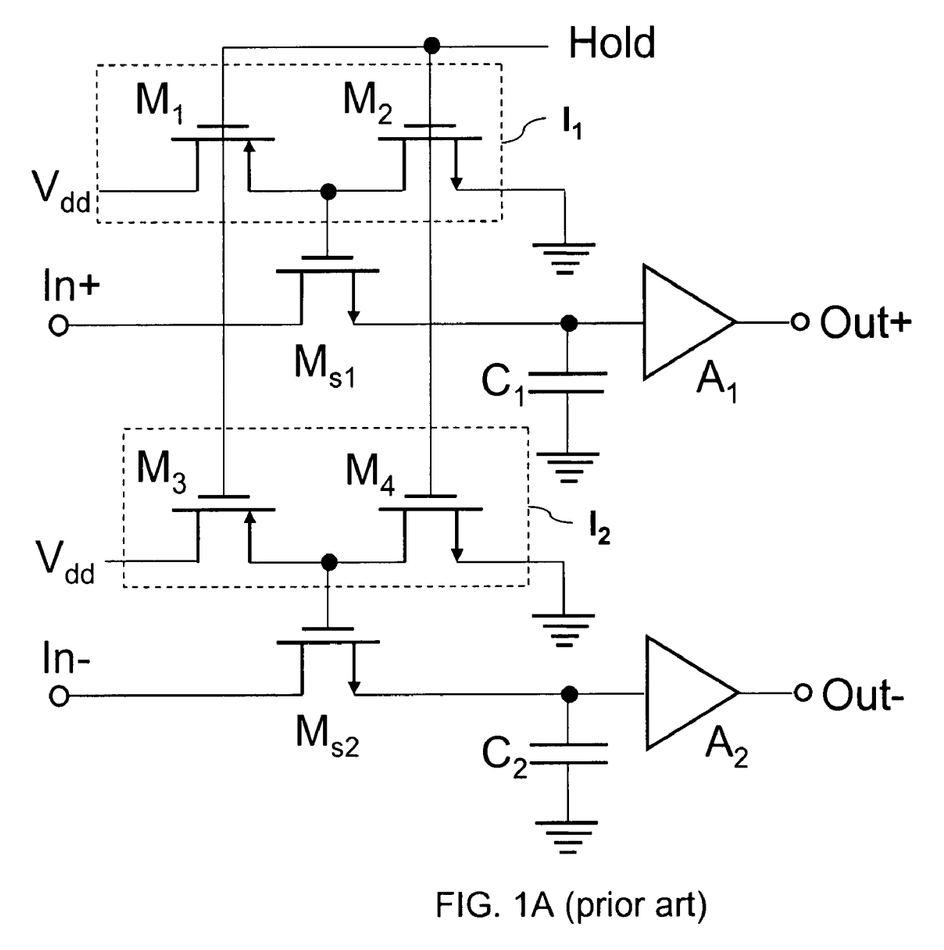
FIG. 1A (prior art) illustrates a conventional differential CMOS track and hold (T/H) circuit.

T/H has advantages, however. For example, in generic high-speed flash-type architectures, T/H helps to shorten the data conversion time. FIG. 1A shows a conventional differential CMOS T/H circuit, which includes two capacitors, $C_1$ and $C_2$, two transistor switches, $M_{s1}$ and $M_{s2}$, and two buffer amplifiers, $A_1$ and $A_2$, for positive and negative inputs. Two inverters, $I_1$ (including transistors $M_1$-$M_2$) and $I_2$ (including transistors $M_3$-$M_4$) act as drivers to drive switches $M_{s1}$ and $M_{s2}$. When $M_{s1}$ and $M_{s2}$ are turned on, Out± tracks In±. When $M_{s1}$ and $M_{s2}$ are turned off, Out± holds the differential voltage present just before the switches $M_{s1}$ and $M_{s2}$ are turned off. If switches $M_{s1}$ and $M_{s2}$ and inverters $I_1$ and $I_2$ are ideal and the hold clock rises infinitely fast, the signal will be held on the two sampling capacitors $C_1$ and $C_2$ when the clock rises, and no error occurs in sampling. All S/H and/or T/H circuits are limited in performance by standard non-ideal factors such as jitter, kT/C noise, sampling group delay and bandwidth, and capacitor non-linearity, etc.

Figure 1B:
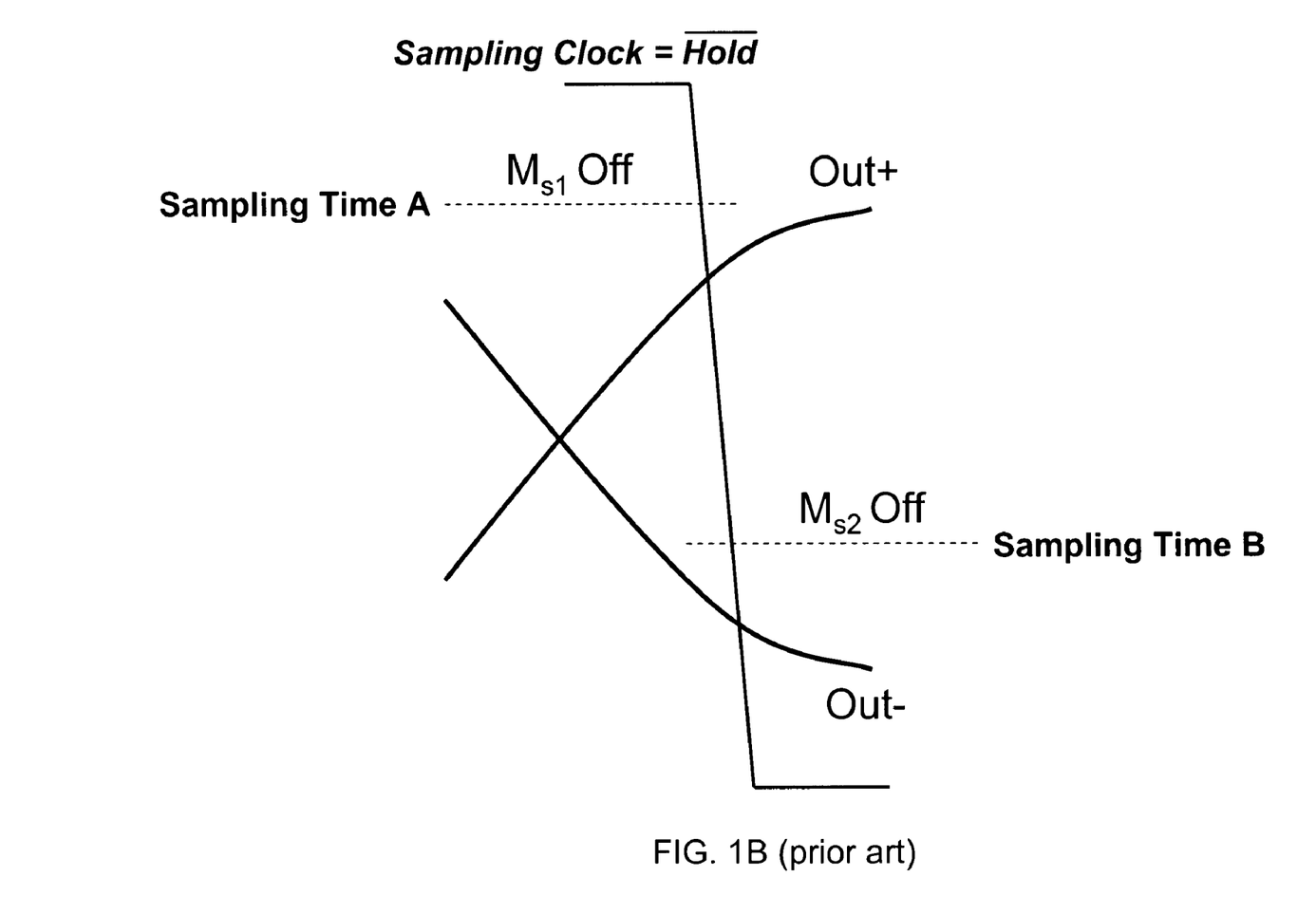
FIG. 1B (prior art) illustrates signal dependent sampling time error that occurs in the FIG. 1A T/H circuit.

Due to the finite rise/fall time of the hold clock applied to the inverters $I_1$ and $I_2$ in FIG. 1A, the two switches $M_{s1}$ and $M_{s2}$ are turned off at different times, as illustrated graphically in FIG. 1B. For example, Out+ is sampled a little earlier than Out− in time. This signal dependent sampling time error contributes both to noise and to non-linearity. In a small signal case when both switches are turned off at about the same time, early and late sampling time errors tend to be somewhat cancelled due to the symmetry in the differential sampling. However, the asymmetry in early and late sampling times still exists for large signal sampling. Therefore, in general, this error increases with larger and higher frequency signals.

With regard to the conventional circuit of FIG. 1A, there are two principle error sources. One is the signal-dependent sampling time error and the other is the switch-related non-linearity error. In the standard bottom-plate S/H circuits, the signal-dependent sampling time error and clock feed-through error are not significant, and only the bottom-plate switch non-linearity matters.

Switch non-linearity has been addressed in S/H circuits. One technique decreases the switch on-resistance by a constant-voltage boosting of the gate over-drive voltage of the bottom-plate switch transistor. See, e.g., Cho, T. B. and Gray, P. R., "A 10-bit, 20-MS/s, 35-mW Pipeline A/D Converter," IEEE J. of Solid-State Circuits, Vol. 30, pp. 166-172, March 1995. This technique results in a smaller voltage drop across the non-linear switch in sampling and thereby the sampling non-linearity is reduced. However, the constant-voltage boosting of the gate over-drive voltage is significantly affected by the signal-dependent switch on-resistance.

Another way is to boost the gate over-drive voltage by a constant voltage over the input signal. See, e.g., Brooks, T. L., Robertson, D. H., Kelly, D. F., Del Muro, A., and Harston, S. W., "A Cascaded Sigma-Delta Pipeline A/D Converter with 1.25 MHz Signal Bandwidth and 89 dB SNR," *IEEE J. of Solid-State Circuits*, Vol. 32, pp. 1896-1906, December 1997. This second technique keeps the switch on-resistance relatively constant. However, the signal-dependent non-linear threshold voltage still modulates the switch on-resistance.

In S/H, the non-linearity in the switch on-resistance is a principal error source in sampling. In S/H, the non-linear threshold voltage variation of the sampling switch can be cancelled by boosting with a feedback amplifier. See, e.g., Pan, H., Segami, M., Choi, M., Ling Cao, and Abidi, A. A., "A 3.3-V 12-b 50-MS/s A/D Converter in 0.6-µm CMOS with Over 80-dB SFDR," IEEE J. of Solid-State Circuits, Vol. 35, pp. 1769-1780, December 2000. However, in T/H, the signal-dependent non-linear channel charge injection also needs to be considered.

SUMMARY OF THE INVENTION

The invention provides circuits that provide a gate boost to address non-linear threshold voltage variation in a CMOS T/H circuit. In embodiments of the invention, a boost capacitor and a feedback amplifier add a signal-dependent threshold voltage to the switch gate over-drive voltage of a switch that controls track and hold circuit sampling. In a modified embodiment, capacitive boost is omitted and the feedback amplifier provides the signal-dependent threshold voltage boost. In another embodiment, a boost capacitor and a diode connected transistor provide the signal-dependent threshold voltage boost. In a modified embodiment, capacitive boost is omitted and the diode connected transistor provides the signal-dependent threshold voltage.

DESCRIPTION OF THE EXEMPLARY EMBODIMENTS

The sampling accuracy in CMOS T/H circuits is improved in embodiments of the invention by keeping switch on-resistance and channel charge injection constant. Embodiments of the invention provide CMOS T/H circuits that make the switch on-resistance and the channel charge injection linear and independent of the signal. Embodiments of the invention address problems with conventional circuits that have been identified by the present inventor. Unlike bottom-plate S/H circuits, conventional T/H circuits experience higher levels of error resulting from switch non-linearity, switch charge injection, and clock feed-through errors. In the differential T/H shown in FIG. 1A, the on-resistances of the two switches $M_{s1}$ and $M_{s2}$ vary as the input signal varies because the on-resistance is inversely proportional to the gate over-drive voltage over the threshold voltage. If this over-drive voltage is linearly proportional to the signal, the sum of the voltage drops across two switches $M_{s1}$ and $M_{s2}$ is linear, and there is no non-linearity error in sampling. However, as the signal changes, the threshold voltages of $M_{s1}$ and $M_{s2}$ vary in a non-linear manner. This signal-dependent threshold voltage makes the voltage drops across two switches $M_{s1}$ and $M_{s2}$ non-linear. Also, due to this signal-dependent threshold voltage, the channel charges on two switches $M_{s1}$ and $M_{s2}$ are non-linear. When the switches $M_{s1}$ and $M_{s2}$ are turned off, portions of their non-linear channel charges are injected into the sampling capacitors $C_1$ and $C_2$. Lastly, even after two switches $M_{s1}$ and $Ms_2$ are turned off, the sampled voltages on the sampling capacitors $C_1$ and $C_2$ are further pulled down by the overlap capacitances of $M_{s1}$ and $M_{s2}$. As seen in FIG. 1B, sample timing of the switches $M_{s1}$ and $M_{s2}$ becomes offset. Sampling time A of the positive differential output voltage precedes and is offset from Sampling time B of the negative differential output voltage. That is, the differential signal is sampled at a wrong time.

Switch-related non-linearity errors take the following three different forms, but are all attributable to non-linear signal-dependent threshold voltage:

1. Signal-dependent non-linear on-resistance;
2. Signal-dependent non-linear channel charge injection; and
3. Signal dependent non-linear clock feed-through.

The non-linear on-resistance error can be reduced using large switches for $M_{s1}$ and $M_{s2}$ or boosting the switch overdrive voltage. However, the non-linear channel charge injection and clock feed-through errors will increase as a result. Also the non-linear channel charge injection and clock feed-through errors can be reduced by using large sampling capacitors, but the settling requirement limits the size of sampling capacitors that may be used and it is preferable to set an optimum sampling capacitor size for converter performance. An optimum capacitance value is determined in view of the settling requirement when sampling switch size and sampling rate are set.

The non-linear clock feed-through error is less significant than the non-linear channel charge injection or non-linear on-resistance. This is because the overlap capacitance of each of the switches $M_{s1}$ and $M_{s2}$ is far smaller than the sampling capacitance of the $C_1$ and $C_2$, and the even-order components of such non-linearity error are partly cancelled in the differential sampling. Embodiments of the invention provide circuits that make the switch on-resistance and the channel charge injection linear and independent of the signal.

Figure 2A:
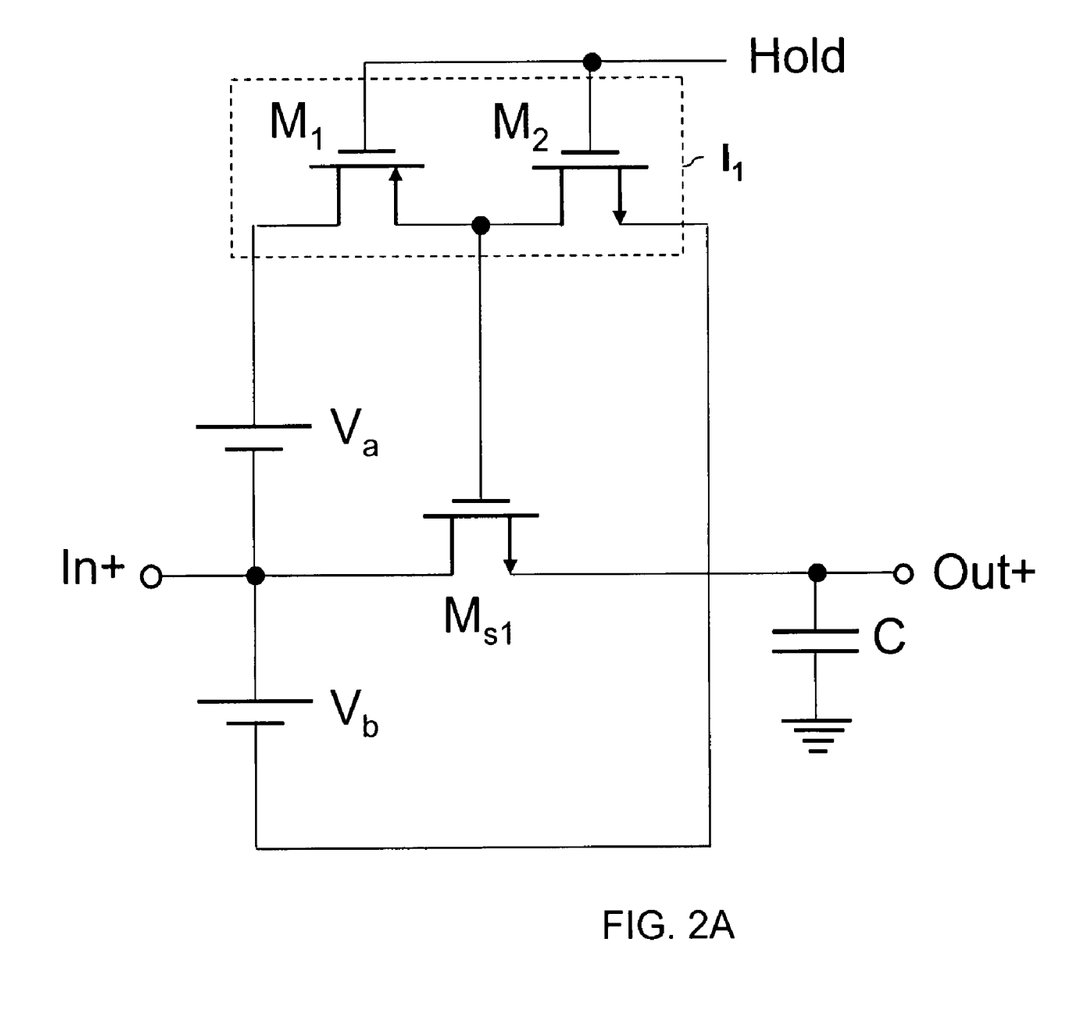
FIG. 2A shows an exemplary embodiment technique for reducing sampling timing errors by applying a signal tracking inverter power supply to transistor switches in the FIG. 1A T/H circuit.
Figure 2B:
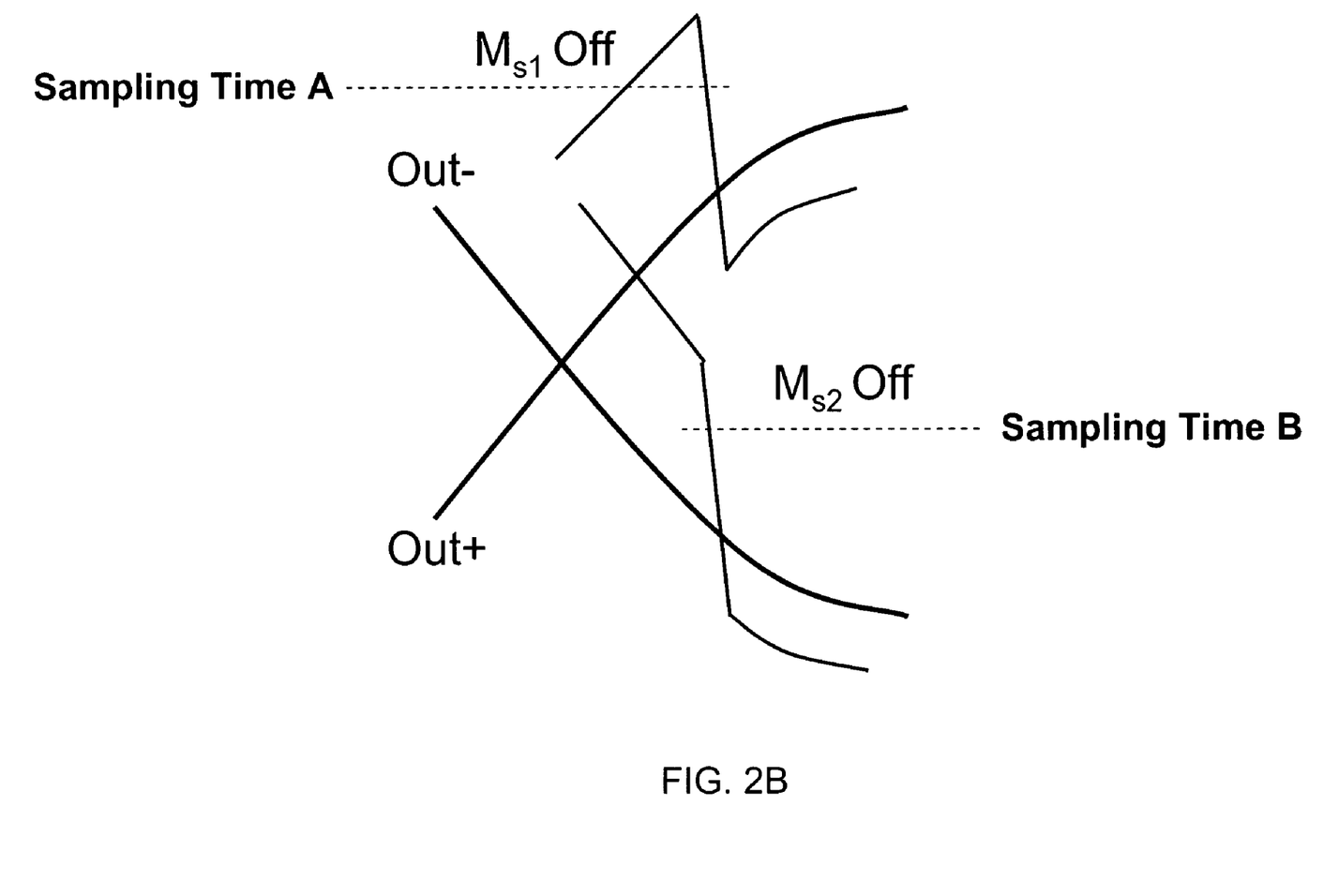
FIG. 2B illustrates reducing of sampling timing error through application of the FIG. 2A circuit.

An embodiment of the invention reduces sampling timing errors by applying a signal tracking inverter power supply to the circuit of FIG. 1A. This technique is applied to the differential T/H circuit, as shown in FIG. 2A. FIG. 2A, for simplicity of illustration, shows half of the FIG. 1A differential circuit. If $V_a$ and $V_b$ are low-impedance voltage sources, turn-off time of the transistor switches $M_{S1}$ $M_{S2}$ can be made independent of the clock rise/fall time in the manner shown in FIG. 2A for the switch $M_{S1}$. The low clock supply voltage $V_b$ can be the most negative supply of the system for simple implementations. As seen in FIG. 2B, this can be used to reduce the timing offset between sampling time A and sampling time B. Given the speed of the currently scaled CMOS technology, this error becomes second-order in differential T/H circuits.

For accurate T/H implementation, the linearization of the sampling switch $M_{S1}$ and the fast rise/fall time of the sampling clock are important. The former depends mostly on the circuit implementation while the latter in general is limited by the speed of the technology. Embodiments of the invention provide standard techniques to reduce the switch non-linearity effect in T/H circuits. Buffer amplifiers $A_1$ and $A_2$ in T/H shown in FIG. 1A are either source follower or unity-gain feedback amplifiers.

Figure 3:
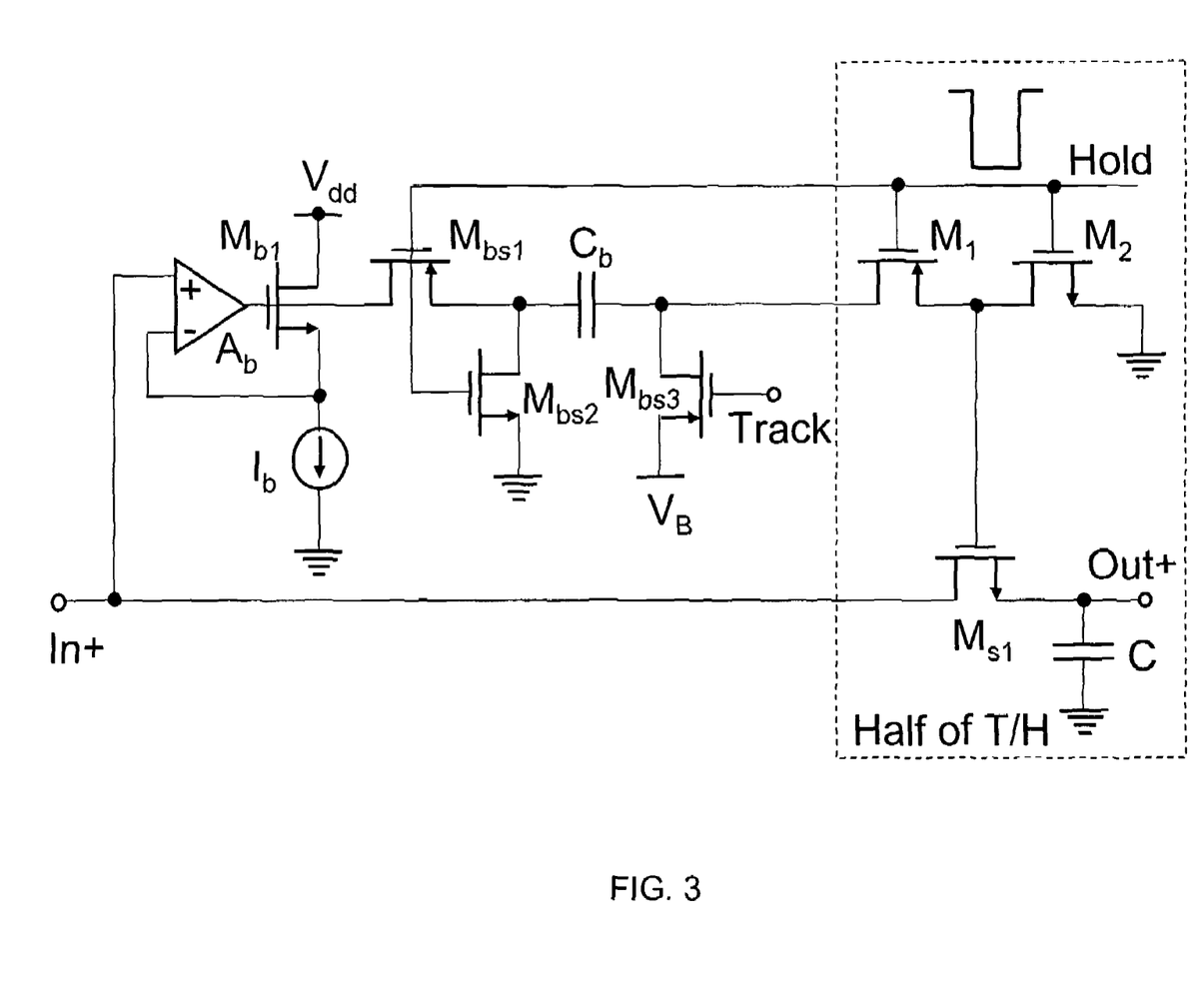
FIG. 3 is a partial view illustrating an exemplary embodiment circuit applied to FIG. 1A T/H circuit to provide gate boost using a feedback amplifier and boost capacitor.

FIG. 3 illustrates a circuit of the invention that provide a gate boost to address non-linear threshold voltage variation in a T/H circuit in accordance with the technique shown in FIG. 2A. As in FIG. 2A, half of the differential T/H circuit is shown for simplicity of illustration. A boost capacitor $C_b$ is charged to a voltage $V_B$ before boosting by turning on transistors $M_{bs2}$ and $M_{bs3}$. While boosting during the track mode, the gate of the switch $M_{s1}$ is raised by the boost capacitor voltage $V_B$ plus the gate-source voltage of $M_{b1}$, which includes the signal-dependent non-linear threshold voltage variation. A feedback amplifier $A_b$ keeps the source voltage of $M_{b1}$ to track the input signal. This approach is based on two assumptions. One is that the threshold voltage of $M_{b1}$ keeps track of that of the switch $M_{s1}$, and the other is that the feedback amplifier $A_b$ is fast enough to neglect its delay in tracking the input signal.

Figure 4:
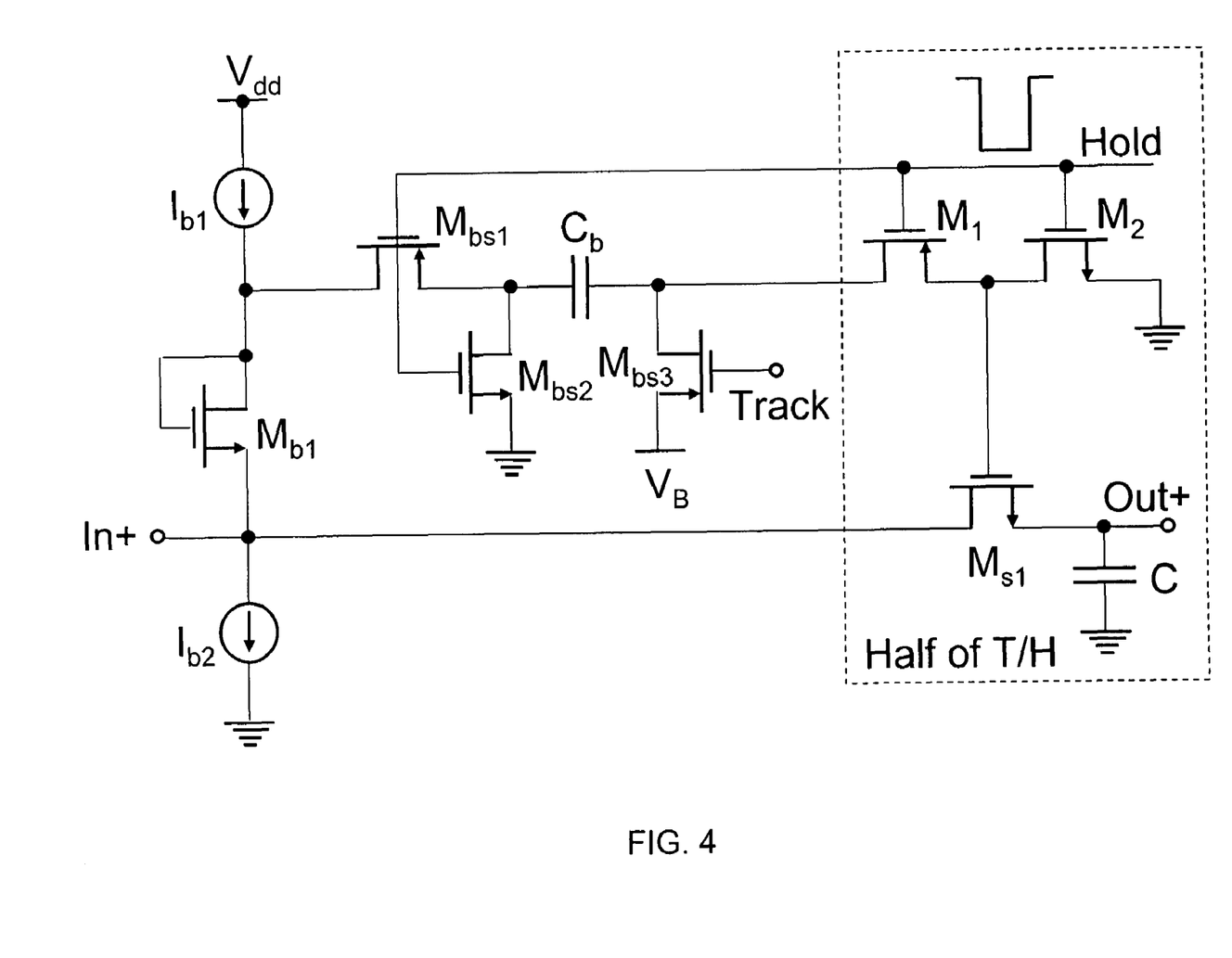
FIG. 4 is a partial view illustrating another exemplary embodiment circuit applied to of the FIG. 1A T/H circuit to provide gate boost using a diode boost and boost capacitor.

FIG. 4 illustrates another embodiment circuit to provide a gate boost to address non-linear threshold voltage variation in a CMOS T/H circuit. As in FIG. 2A, half of the differential T/H circuit is shown for simplicity of illustration. The FIG. 4 circuit addresses the wide bandwidth requirement that is imposed upon the feedback amplifier $A_b$ of FIG. 3 by implementing diode boosting. FIG. 4 provides an alternative method to FIG. 3 to add the signal-dependent threshold voltage to the switch gate over-drive voltage. A diode-connected transistor $M_{b1}$ can raise the boost voltage by its gate-source voltage drop without feedback since the small-signal diode resistance is low. This diode-input configuration demands large current driving capacity from the input source, but a bias current $I_{b2}$ alleviates the current driving capacity requirement on the input source. The input source needs only to drive $|I_{b1}-I_{b2}|$. In both of the FIG. 3 and FIG. 4 embodiments, process-dependent parameters of $M_{s1}$ such as mobility and threshold voltage are cancelled out using a process parameter correction transistor $M_{b1}$.

Figure 5:
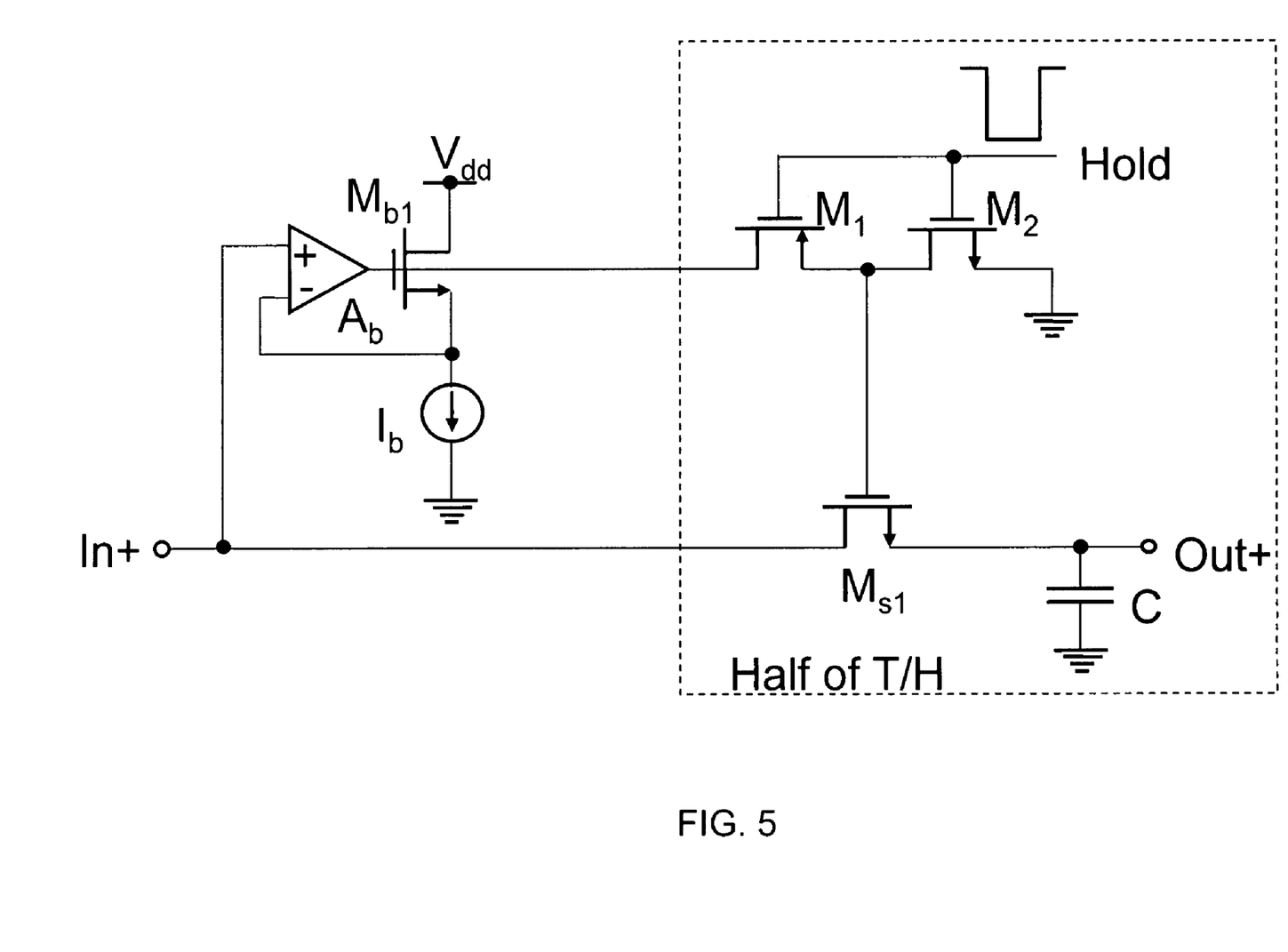
FIG. 5 is a partial view illustrating a modified embodiment based upon FIG. 3 applied to FIG. 1A T/H circuit to provide gate boost using a feedback amplifier.
Figure 6:
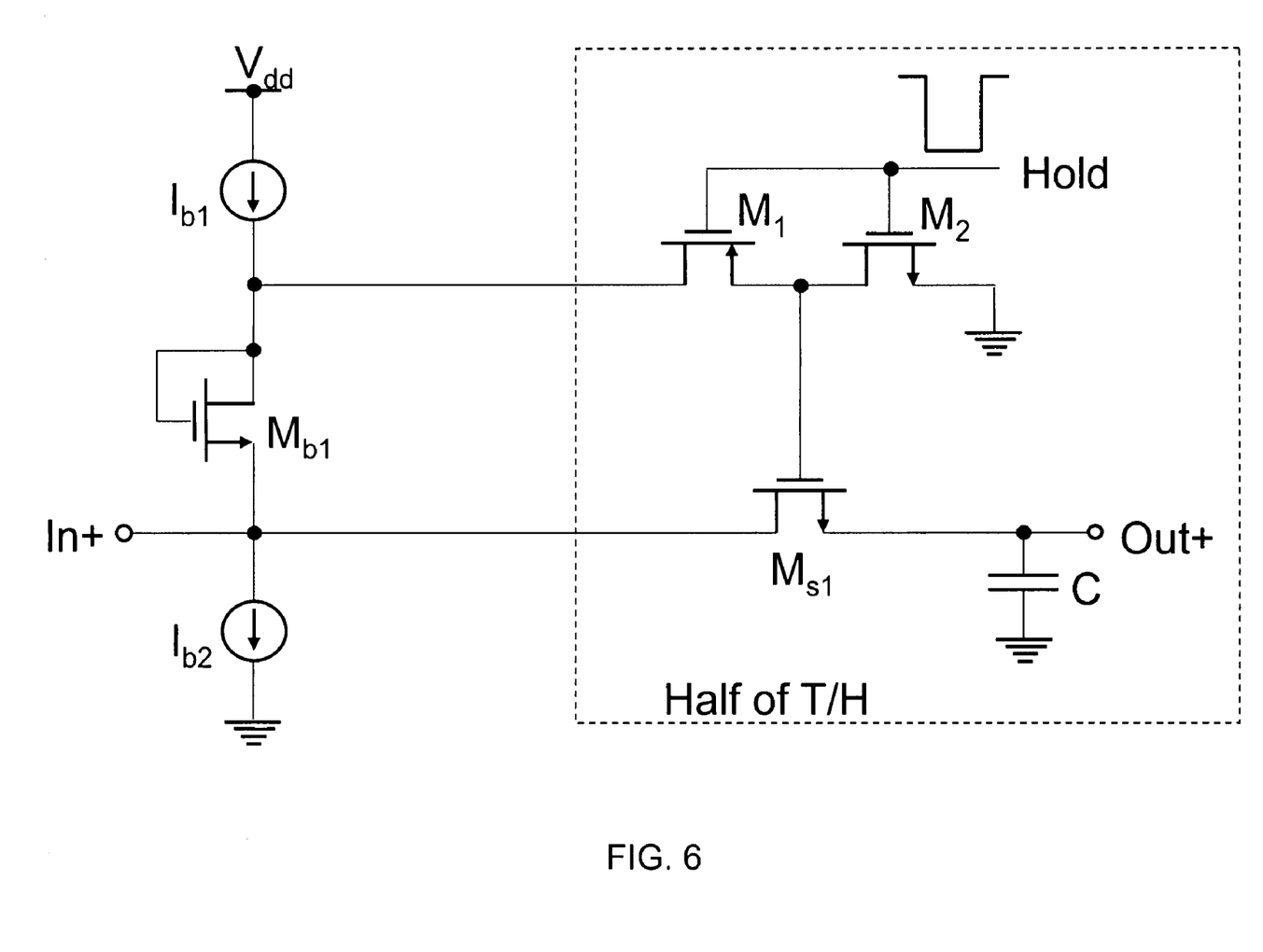
FIG. 6 is a partial view illustrating a modified embodiment based upon FIG. 4 applied to the FIG. 1A T/H circuit to provide gate boost using a diode boost.

Alternate embodiment circuits are shown in FIGS. 5 and 6. The FIG. 5 circuit is based upon the FIG. 3 circuit. The FIG. 6 circuit is based upon the FIG. 4 circuit. As in FIG. 2A, half of the differential T/H circuit is shown for simplicity of illustration. In each of FIGS. 5 and 6, the voltage boost provided by the boost capacitors is avoided. In the circuit of FIG. 5, the amplifier $A_b$ provides the boost. In the circuit of FIG. 6, the diode connected transistor $M_{b1}$ provides the boost. While providing a gate voltage boost, the lack of capacitance may result in a large over-drive voltage that can contribute to extra charge injection.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A differential track and hold circuit, each half of the differential track and hold circuit comprising:
   - a sampling capacitor for holding a positive or negative version of an input voltage to be sampled;
   - a switch for providing the positive or negative version of the input voltage to the sampling capacitor, such that when the switch is turned off, the sampling capacitor holds the voltage delivered to it by the switch just before the switch is turned off;
   - a driver to control the switch;
   - a buffer amplifier to output a sampled voltage held by the sampling capacitor; and
   - means for reducing switch non-linearity in the switch by adding a signal-dependent threshold voltage to a gate over-drive voltage of the switch such that the on-resistance and the channel charge injection of said switch is made linear and independent of the input voltage.

2. The circuit of claim 1, wherein said means for reducing comprises a signal-dependent threshold voltage source.

3. The circuit of claim 2, wherein said means for reducing comprises a feedback amplifier that is connected to a gate of said sampling transistor to cause a source voltage of the sampling transistor to track the input voltage.

4. The circuit of claim 2, wherein said means for reducing comprises diode boosting.

5. The circuit of claim 1, wherein said means for reducing comprises:
   - a boost capacitor controlled to boost the gate over-drive voltage of the switch during a track mode by a capacitor voltage plus the gate-source voltage of a process parameter correction transistor; and
   - a feedback amplifier that causes the source voltage of a boost transistor to track the input voltage and boosts the gate over-drive voltage of the switch.

6. The circuit of claim 1, wherein said means for reducing comprises:
   - a feedback amplifier that causes the source voltage of a boost transistor to track the input voltage and boosts the gate over-drive voltage of the switch.

7. The circuit of claim 1, wherein said means for reducing comprises:
   - a boost capacitor controlled to boost gate over-drive voltage of the switch during a track mode by a capacitor voltage plus the gate-source voltage of a process parameter correction transistor; and
   - a diode-connected transistor to track the input voltage and boost the gate over-drive voltage of the switch.

8. The circuit of claim 7, further comprising a bias current source to provide bias current to the diode-connected transistor.

9. The circuit of claim 1, wherein said means for reducing comprises:
   - a diode-connected transistor to track the input voltage and boost the gate over-drive voltage of the switch.

10. The circuit of claim 9, further comprising a respective bias current source to provide bias current to the diode-connected transistor.

* * * * *